(12) United States Patent
Pratt et al.

(10) Patent No.: US 7,902,892 B2
(45) Date of Patent: Mar. 8, 2011

(54) METHOD OF CONTROL SLOPE REGULATION AND CONTROL SLOPE REGULATION APPARATUS

(75) Inventors: Patrick Pratt, Mallow (IE); Denis Dineen, Ballincollig (IE); Michael O'Brien, Youghal (IE)

(73) Assignee: Freescale Semiconductor, Inc., Austin, TX (US)

( * ) Notice: Subject to any disclaimer, the term of this patent is extended or adjusted under 35 U.S.C. 154(b) by 137 days.

(21) Appl. No.: 12/440,663

(22) PCT Filed: Sep. 11, 2006

(86) PCT No.: PCT/EP2006/066243
§ 371 (c)(1),
(2), (4) Date: Mar. 10, 2009

(87) PCT Pub. No.: WO2008/031454
PCT Pub. Date: Mar. 20, 2008

(65) Prior Publication Data
US 2009/0289678 A1    Nov. 26, 2009

(51) Int. Cl.
*H03K 5/12* (2006.01)

(52) U.S. Cl. .......................................................... 327/170
(58) Field of Classification Search .................. 327/170, 327/134
See application file for complete search history.

(56) References Cited

U.S. PATENT DOCUMENTS

| 5,231,317 | A | * | 7/1993 | Mittelberg ...................... 327/13 |
| 5,278,994 | A | | 1/1994 | Black et al. |
| 6,617,895 | B2 | * | 9/2003 | Zumkehr et al. ............... 327/170 |
| 7,656,209 | B2 | * | 2/2010 | Mei ................................ 327/170 |
| 7,663,418 | B2 | * | 2/2010 | Dale et al. ..................... 327/170 |
| 2004/0176049 | A1 | | 9/2004 | Nagode et al. |

FOREIGN PATENT DOCUMENTS

EP    1463197 A1    9/2004

* cited by examiner

*Primary Examiner* — Hai L Nguyen

(57) ABSTRACT

A control loop has a control slope associated therewith. The control loop is provided to control a unit under control. A method of regulating the control slope comprises the step of measuring the control slope of the control loop and modifying a parameter associated with the unit under control in order to maintain the control slope within a desired range. Lock of the control loop is therefore maintained.

20 Claims, 3 Drawing Sheets

METHOD OF CONTROL SLOPE REGULATION AND CONTROL SLOPE REGULATION APPARATUS

FIELD OF THE INVENTION

This invention relates to a method of regulating a control slope of, for example, a control loop associated with a unit under control, such as a power amplifier. This invention also relates to a control slope regulation apparatus for regulating a control slope of, for example, a control loop associated with a unit under control, such as a power amplifier.

BACKGROUND OF THE INVENTION

In the field of Radio Frequency (RF) communications, wireless communications devices in a wireless communications network, for example a cellular telecommunications network, possess transceiver circuits. It is known that transceiver circuits comprise, inter alia, a transmitter circuit.

Typically, a wireless communications network is designed and built so as to comply with one or more communications standards. One example of a communications standard is the Global System for Mobile communications (GSM) standard, which imposes strict requirements upon the function of a Mobile Subscriber (MS) handset that constitutes a wireless communications device. Of course, other Time Division Multiple Access (TDMA) communications standards exist as well as standards for other multiple access schemes.

In relation to the GSM standard (and others), an MS handset can transmit on a given channel. However, limitations are imposed upon power that can be generated in adjacent channels when transmitting on the given channel. In this respect, a so-called Switching Output Radio Frequency Spectrum (SxORFS) specification is associated with operation of the transmitter circuit, which operates in a burst mode.

Hence, it is important to maintain power control for the transmitter circuit throughout a transmission in order to comply with, inter alia, the SxORFS specification. In some operating conditions associated with the transmitter circuit, deviation from the SxORFS specification can occur, for example when a power amplifier of the transmitter circuit "ramps down" from a saturated state.

One known control loop circuit comprises a reference ramp generator arranged to generate a digital signal that is used to control a power amplifier that amplifies an input data signal to be transmitted by the transceiver circuit via an antenna. The digital signal has a profile that ramps up, maintains a level for a predetermined period of time and then ramps down again. The digital signal is fed to a digital-to-analogue converter and then low-pass filtered to yield a reference voltage signal. The reference voltage signal is fed to a summation unit that also receives a negative detection voltage signal. An output of the summation unit, constituting an error signal, is coupled to a controller that implements a proportional-integral control algorithm in order to yield an automatic power control voltage signal for controlling a bias of the power amplifier. A sample of an output signal of the power amplifier is obtained using a directional coupler, the sample of the output signal being processed by a detection unit capable of generating the detection voltage signal that is a measure of the power generated by the power amplifier, expressed as a voltage signal.

When operating, the power amplifier can run hot, a battery providing a supply voltage can be running low or the power amplifier can be transmitting in certain frequency "corners" that result in the power amplifier being unable to achieve a maximum output power of, for example, 33 dBm, when required to do so. This results in a persistent error signal due to a persistent difference between the reference voltage signal and the detection voltage signal. The controller therefore continually attempts to change the automatic power control voltage signal in order to try to achieve a maximum output power at the output of the power amplifier, and so the output power of the amplifier saturates and the bandwidth of the control loop collapses to zero; this state is known herein as "hard" saturation. Consequently, when the output power of the power amplifier ramps down at the end of a burst, the power amplifier must first "wind down" from the saturated state, and such winding down requires time to do so. However, in order to comply with the communications standard, the output power of the transmitter circuit has to ramp down within a predetermined period of time and a profile of the ramp down has to possess a predetermined shape, for example a raised-cosine function profile.

Of course, if a proportion of the time allotted for ramp-down is used to wind the power amplifier down, the power amplifier has to complete the ramp-down according to the raised-cosine profile in the remaining (less) time and so the ramp-down has a steeper gradient than would otherwise be the case if it was not necessary to unwind from the saturated state. Consequently, the likelihood of out-of-band interference being generated, i.e. in adjacent channels, is increased.

One known partial solution to the generation of the out-of-band interference is disclosed in US patent publication no. US 2004/0176049 A1, where first and second error signals are generated and used when applying a limit reference input (AOC_MAX) of a controller of a radio communications transmitter. However, the circuit proposed in US 2004/0176049 A1 does not cure generation of the out-of-band interference in some circumstances.

In some instances, the circuit can achieve a target output power so that a detected error between actual output power and the target output power is zero. When this occurs, the power amplifier can be sufficiently compressed such that satisfactory SxORFS performance for a ramp down event cannot be guaranteed. In this respect, upon reaching the target output power, the bandwidth of a control loop comprising the power amplifier collapses to a non-zero value below a minimum threshold value and so the loop is unable to maintain lock; this state is known herein as "soft" saturation. Alternatively, another saturation state can occur when the output power reaches the target output power, but the bandwidth of the control loop collapses to zero; this state is known herein as "virtual" saturation. Hence, it can be seen that bandwidth and thus lock of the control loop are not always guaranteed in relation to the circuit of US 2004/0176049.

STATEMENT OF INVENTION

According to the present invention, there is provided a method of regulating a control slope and a control slope regulation apparatus as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
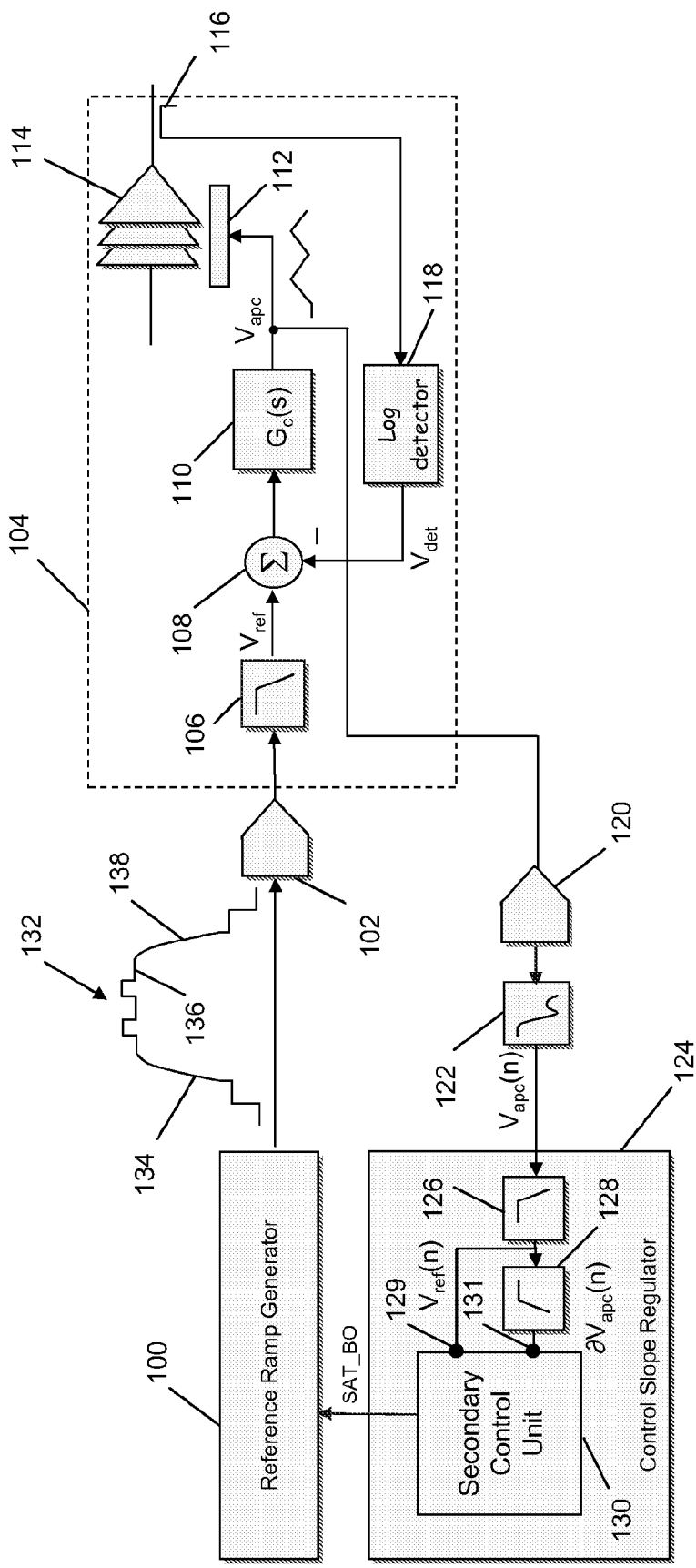
FIG. 1 is a schematic diagram of a control slope regulation apparatus constituting an embodiment of the invention.

Throughout the following description identical reference numerals will be used to identify like parts.

Referring to FIG. 1, a reference ramp generator 100 is coupled to a Digital-to-Analogue Converter (DAC) 102, the DAC 102 being coupled to a control loop 104, in particular a first low-pass filter 106 of the control loop 104. In the control loop 104, the low-pass filter 106 is coupled to a first input of a summation unit 108, an output of the summation unit 108 being coupled to an input of a primary control unit 110. In this example, the primary control unit 110 implements a proportional-integral control algorithm.

A bias control circuit 112 of a power amplifier 114 is coupled to an output of the primary control unit 110 and constitutes a unit under control. In this example, the power amplifier 114 is part of a transmitter sub-circuit of a transceiver circuit of an RF communications device, such as a cellular telecommunications handset. Of course, the unit under control need not be the power amplifier 114 and can be any suitable device, circuit or otherwise (referred to as a "plant" in control theory parlance) that needs to be controlled.

In this example, a directional coupler 116 is coupled to an output of the power amplifier 114 and is also coupled to a detection unit 118, for example a log detector. The detection unit 118 is also coupled to a second input of the summation unit 108.

In order to provide control slope regulation functionality, the output of the primary control unit 110 is also coupled to a feedback path comprising an Analogue-to-Digital Converter (ADC) 120, the ADC 120 being coupled to a Sinc filter 122. The Sinc filter 122 of the feedback path is coupled to a control slope regulator apparatus 124, in particular an input of a second low-pass filter 126.

An output of the second low-pass filter 126 is coupled to an input of a high-pass filter 128 in the feedback path as well as a first input 129 of a secondary control unit 130. An output of the high-pass filter 128 is coupled to a second input 131 of the secondary control unit 130 in the feedback path. A regulation output of the secondary control unit 130 is coupled to a regulation input of the reference ramp generator 100.

In operation, in order for the RF communications device to transmit information, a transmission burst has to be generated by the transmitter sub-circuit of the transceiver. The reference ramp generator 100 therefore generates a normalised reference signal, the normalised reference signal being scaled by the reference ramp generator 100 to yield a reference voltage signal 132. In this respect, an 'external' scaling value is provided to a 'PWR' scaling input (not shown) of the reference ramp generator 100 in order to provide the degree of scaling of the normalised reference signal calibrated as required to achieve a target output power at the output of the power amplifier 114.

In this example, the reference voltage signal 132 has a profile for driving the power amplifier 114 in accordance with Gaussian Minimum Shift Keying (GMSK) bias control for the GSM standard. Consequently, the profile comprises a ramp-up portion 134, an active portion 136 and a ramp-down portion 138, the ramp-up and ramp-down portions having a so-called "raised cosine" shape. Typically, the active portion 136 is level. The skilled person will, of course, appreciate that other profiles can be employed for other applications. However, in order to be able to measure changes to a control slope of the control loop 104, the reference ramp generator 100 is arranged to amplitude modulate the active portion 136, i.e. after ramp-up and before ramp-down portions 134, 138. The provision of the amplitude modulation constitutes providing a perturbation on the active portion 136.

The generated reference voltage signal is a digital signal that is converted to the analogue domain by the DAC 102, the analogue reference voltage signal then being low-pass filtered by the first low-pass filter 106. The filtered analogue reference signal (hereinafter referred to as the reference voltage, $V_{ref}$) is combined with a negative feedback signal $V_{det}$ in the summation unit 108.

The summation unit 108 outputs an error signal that is used by the primary control unit 110 in order to modify an automatic power control voltage signal, $V_{apc}$, constituting a control voltage signal. In this example, the primary control unit 110 has a frequency response, $G_c$. The control signal is used to set the bias control circuit 112 in order to achieve the target output power at the output of the power amplifier 114.

By virtue of the directional coupler 116, a portion of the output signal of the power amplifier 114 is tapped off and represented by the detection unit 118 as the feedback voltage signal, $V_{det}$, having a like slope and scale to that of the reference voltage, $V_{ref}$. The feedback voltage signal, $V_{det}$, has a negative amplitude in order to achieve a subtraction at the summation unit 108.

The control voltage signal, $V_{apc}$, is also converted back to the digital domain by the ADC 120, the digitised control voltage signal, $V_{apc}(n)$, then being filtered by an optional digital filter, for example the Sinc filter 122. Thereafter, the control slope regulator apparatus 124 processes the filtered digitised control signal, $V_{apc}(n)$ in order to measure the control slope of the control loop 104.

In this respect, the control signal, $V_{apc}(n)$, is effectively band-pass filtered by the second low-pass filter 126 and the high-pass filter 128, but the second low-pass filter 126 and the high-pass filter 128 have been employed separately in order to extract a low-pass filtered version of the digitised control signal, $V_{apc}(n)$, for the first input 129 of the secondary control unit 130. A band-pass filtered version of the digitised control signal, $\partial V_{apc}(n)$, is provided at the second input 131 of the secondary control unit 130. The secondary control unit 130 then processes the band-pass filtered version of the digitised control signal, $\partial V_{apc}(n)$, in order to measure the control slope of the control loop 104 and determine whether the control slope is within a desired range. As described later herein, the low-pass filtered version of the digitised control signal, $\partial V_{apc}(n)$, is used to handle a special case where the power amplifier 114 "hard" saturates during ramp up and before the perturbation can be applied.

If the control slope is not within the desired range, secondary control unit 130 generates a regulation signal, sat_bo, in order to instruct the reference ramp generator 100 to "back-off" the power generated by the power amplifier 114. This is achieved by the reference ramp generator 100 modifying the scaling applied to the normalised reference signal mentioned above.

It has been discovered that the control slope of the control loop 104 relates directly to the ability of the control loop 104 to maintain lock on a target output power. In this respect, it has been noted that the bandwidth of the control loop 104, a factor that dictates the ability of the control loop 104 to maintain lock, "collapses" in a proportional manner with collapse of the control slope. In order to be able to measure the control slope of the control loop 104, the secondary control unit 130 processes the low-pass version and the band-pass version of the digitised control signal, $\partial V_{apc}(n)$ in a manner that will be described hereinbelow.

Information regarding the control slope is available from the frequency response between the control voltage signal, $V_{apc}$, and the reference signal, $V_{ref}$:

$$\frac{V_{apc}}{V_{ref}} = \frac{G_c}{1+G_{ol}} = \frac{G_c}{1+k_p k_d G_c G_p G_d}$$

Where:
$G_c$ is the frequency response of the primary control unit 110,
$G_{ol}$ is the open-loop frequency response of the control loop 104,
$G_p$ is the normalised small signal linearised frequency response of the power amplifier 114,
$G_d$ is the normalised small signal linearised frequency response of the detection unit 118,
$k_p$ is the small signal DC response of the power amplifier 114 at the output power of the power amplifier 114,
$k_d$ is the small signal DC response of the detection unit 118 at the output power of the power amplifier 114.

At low frequency, the magnitude of the frequency response of the primary control unit 110 tends towards infinity ($|G_c|\to\infty$) due to the presence of the integral part of the closed loop control algorithm implemented by the primary control unit 110. Additionally:

$$\lim_{\omega\to 0}\frac{V_{apc}}{V_{ref}} \to \frac{1}{k_p k_d G_p G_d} = \frac{1}{k_p k_d}$$

Hence, at low frequencies, the frequency response between the control voltage signal, $V_{apc}$, and the reference voltage signal, $V_{ref}$, is inversely proportional to the control slope, the product $k_p k_d$. The response of the control voltage signal, $V_{apc}$, to the perturbation placed on the reference voltage signal, $V_{ref}$, can therefore be used to extract information regarding the control slope, when the perturbation is at low frequency.

Figure 2:
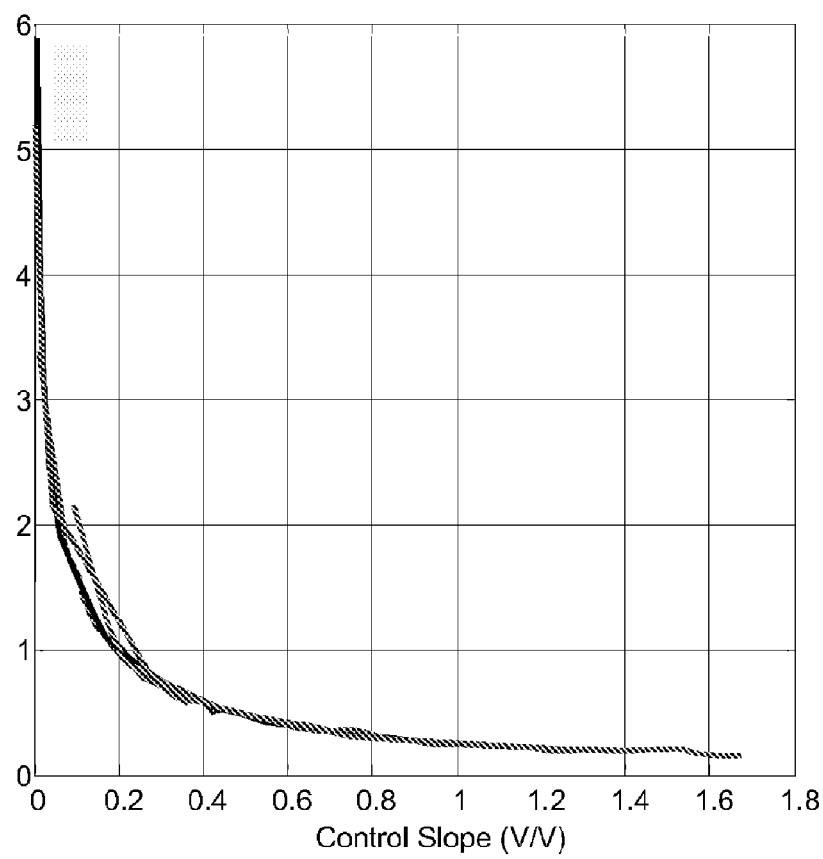
FIG. 2 is a graph of control slope performance associated with the apparatus of FIG. 1.

Referring to FIG. 2, and based upon the limit equation, for a given level of perturbation on the reference signal, $V_{ref}$, the control voltage signal, $V_{apc}$, deviates in a manner inversely proportional to the control slope. However, since the use of the perturbations can adversely affect key transmission performance characteristics associated with the power amplifier 114, for example phase error and modulation ORFS (mod ORFS), the frequency, amplitude and duty cycle of perturbations are programmable. In this example, the perturbations translate to a 0.1 dB change to the output power of the power amplifier 114.

Typically, 10 bit resolution is employed by the reference ramp generator 100 in order to generate the reference voltage signal, $V_{ref}$. However, in this example, in order to control the amplitude of the perturbations with greater accuracy, 11 bit resolution is employed. The perturbations have, in this example, a frequency in a range between about 10 kHz and about 50 kHz. The duty cycle of the perturbations can be between about 50% and about 1%. Further, the perturbations are only applied, as mentioned above, during the active portion of the burst profile. Typically, the active portion 136 is provided with the perturbations only when the power amplifier 114 is required to achieve output powers close to a maximum possible output power for the power amplifier 114, for example greater than 31 dBm in respect of a maximum output power of 33 dBm. Consequently, when the perturbations are not being provided, elements constituting the feedback path mentioned above can be powered down in order to reduce power consumption of the circuit.

Since the band-pass filtered version of the control voltage signal, $V_{apc}(n)$ corresponds to a computation of the deviation of the control voltage signal, $\partial V_{apc}$, the secondary control unit 130 processes the band-pass filtered version of the control voltage signal, $\partial V_{apc}$, in order to determine whether the control slope of the control loop 104 is above a pre-set threshold level, $V_T$. In the event that the deviation of the control voltage signal, $\partial V_{apc}$, exceeds the threshold level, $V_T$, the control slope is deemed to be collapsing along with the bandwidth of the control loop 104; this collapse occurs when the power amplifier 114 saturates and so the control voltage signal, $V_{apc}$, applied to the bias control circuit 112 needs to be backed off by application of the regulation signal, sat_bo, to the reference ramp generator 100 by the secondary control unit 130.

For a special case where the power amplifier 114 saturates on ramp-up and the control voltage signal, $V_{apc}$, has reached a maximum limit thereof, the low-pass filtered version of the control voltage signal, $V_{apc}$, is processed by the secondary control unit 130, as the deviation of the control voltage signal, $\partial V_{apc}$, simply suggests an infinite control slope. Since this is clearly not the case, the secondary control unit 130 monitors the absolute value of the control voltage signal, $V_{apc}$, and if it exceeds an upper bound it can be concluded that the power amplifier 114 has "hard" saturated during ramp-up and so corrective action can be taken to back-off the output power of the power amplifier 114. When this hard saturation occurs, application of the perturbations is temporarily disabled.

Figure 3:
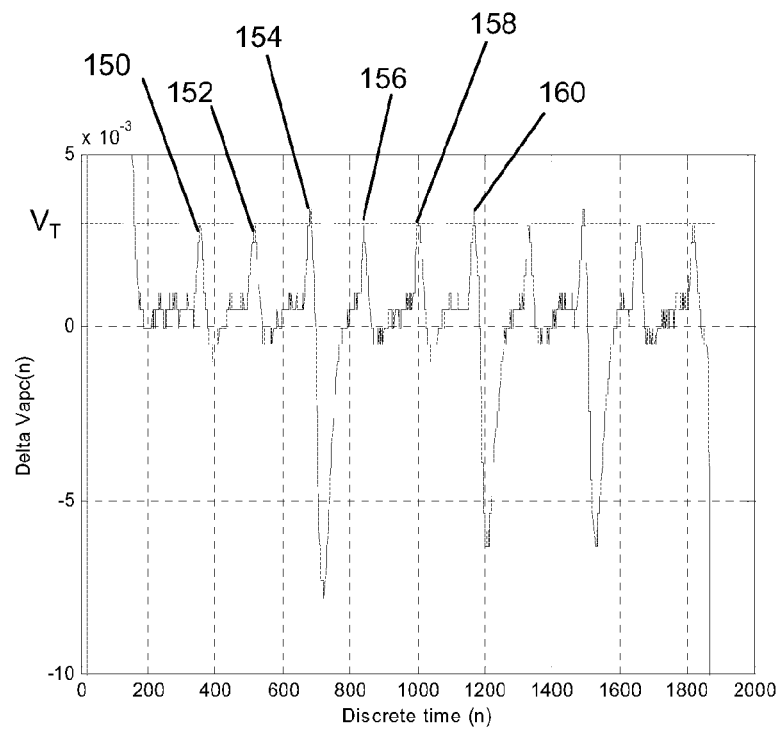
FIG. 3 is a graph of a control voltage signal deviation versus time.
Figure 4:
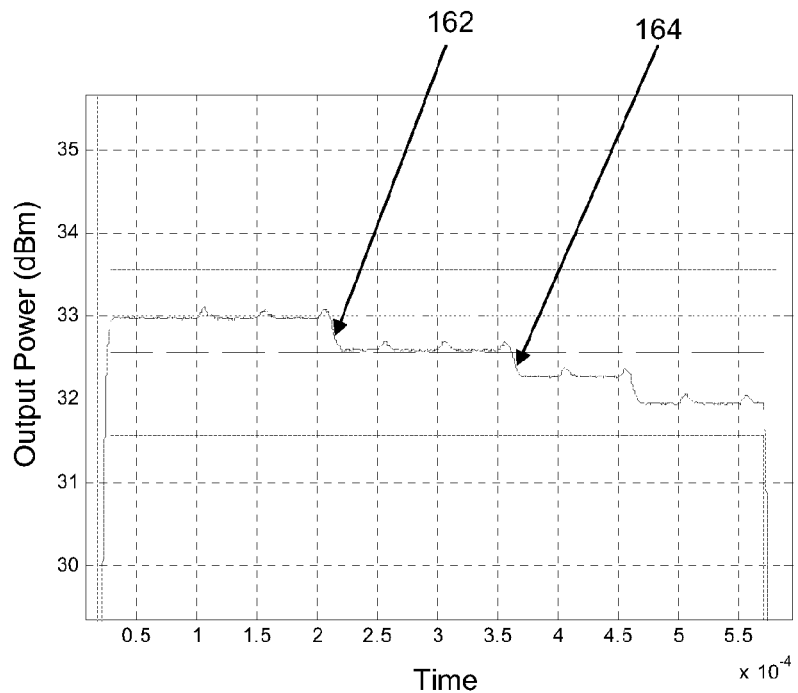
FIG. 4 is a graph of output power versus time.

Referring to FIGS. 3 and 4, deviations of the control voltage signal, $\partial V_{apc}$, can occur when so-called "slope droop" takes place across the burst implemented by the power amplifier in an attempt to follow the profile of the normalised reference signal. Slope droop can occur when the charge on a battery of an electronic device, such as the cellular telephone handset mentioned above, is nearing depletion.

Consequently, whilst the deviations of the control voltage signal, $\partial V_{apc}$, in respect of a first perturbation 150 and a second perturbation 152, in the present example, do not exceed the threshold level, $V_T$, a third perturbation 154 does exceed the threshold level. This behaviour translates into the following output power, $P_{out}$, performance of the power amplifier 114. In respect of the first and second perturbations 150, 152, the output power, $P_{out}$, of the power amplifier 114 remains at a maximum level of 33.0 dBm. However, in respect of the third perturbation 154, the secondary control unit 130 calculates that the third perturbation 154 has exceeded the threshold level, $V_T$, and so generates the regulation signal, sat_bo. The regulation signal, sat_bo, indicates the amount of power back-off required and can be expressed as:

$$BO+k_{BO}\partial V_{apc}(n)$$

Where:
BO is a fixed constant back-off value,
$k_{BC}$ is a scalar value, and
$\partial V_{apc}(n)$ is the deviation of the sampled control voltage signal.

$k_{BO}$ is selected such that the product $k_{BO}\partial V_{apc}(n)$ is a dynamically weighted back-off step size that is inversely proportional to the control slope of the control loop 104, i.e. the "smaller" the control slope, the larger the back-off step. $k_{BO}$ is empirically determined prior to use of the power amplifier 114 and stored in a look-up table for use by the secondary control unit 130. The criterion for selecting a value for $k_{BO}$ is that the product $k_{BO}\partial V_{apc}(n)$ should result in a back-off such that the control slope is set to its minimum value selected. The use of the constant back-off value, BO, thus ensures that the control slope is always adjusted to above the minimum value therefor. In this example, the back-off step set by the regulation signal, sat_bo, is 0.5 dBm, constituting a first power back-off 162.

This first power back-off 162 succeeds in causing the deviation of the control voltage signal, $\partial V_{apc}$, to return to a level below the threshold, $V_T$, in respect of a fourth perturbation 156 and a fifth perturbation 158. However, due to the slope droop mentioned above, the sixth perturbation 160 again eventually exceeds the threshold value, $V_T$, and so the regulation signal, sat_bo, generated by the secondary control unit 130 causes the reference ramp generator 100 to back the control voltage signal, $V_{apc}$, off by a first quantum and hence the power output of the power amplifier 114 too. In this example, backing the control voltage signal, $V_{apc}$, off by a second quantum results in the second power back-off 164, i.e. in this example a further reduction of 0.5 dBm to the output power of the amplifier 114. This process continues in order to maintain the deviation of the control voltage signal, $\partial V_{apc}$, below the threshold value, $V_T$, and hence prevent collapse of the control slope and the bandwidth of the control loop 104. However, in this example, a settling time is set to elapse between successive back-offs, because the control loop 104 is dynamic and does not respond instantaneously to a back-off. After each back-off a time is therefore allowed for the control loop 104 to respond to the back-off. To do otherwise would, in this example, result in repeated back-offs being triggered in quick succession causing an unacceptable drop in the output power of the power amplifier 114.

In extreme saturation conditions, where the control voltage signal, $V_{apc}$, ramps up and remains at an upper limit thereof prior to application of the perturbations (as mentioned above), the deviation of the control voltage signal, $\partial V_{apc}$, is not detectable and so the control slope cannot be measured. In order to obviate this limitation, a threshold can be set in respect of the magnitude of the control voltage signal, $V_{apc}$, so that a power back-off is triggered when the magnitude of the control voltage signal, $V_{apc}$, exceeds the threshold. In this example, the (upper) threshold is a design time-defined constant close to an upper limit of an output of the Sinc filter 122 and/or the ADC 120. If the control slope of the control loop 104 falls below the pre-set threshold level, $V_T$, the power amplifier 114 is deemed to have saturated and so a back-off is required. In this case, it is assumed that the control voltage signal, $V_{apc}$, will never, during a current time slot, need to exceed a current value of the control voltage signal, $V_{apc}$. The current value of the control voltage signal, $V_{apc}$, is therefore sampled and used as the upper threshold for the control voltage signal, $V_{apc}$, for the remainder of the time slot. For a subsequent time slot, the upper threshold for the control voltage signal, $V_{apc}$, reverts back to the design time-defined value.

In order to avoid multiple back-offs for different reasons, the provision of the perturbations is temporarily disabled, as already explained above, when an extreme saturation condition occurs.

Whilst in the above example, the control voltage signal, $V_{apc}$, is backed off, other parameters of the power amplifier can be modified in order to maintain the control slope within the desired range, for example adjusting one or more parameter of a tuning circuit associated with the power amplifier 114. Of course, in the general case, any suitable parameter capable of maintaining the control slope within the desired range can be modified in relation to the unit under control.

It is thus possible to provide a method and apparatus capable of regulating a control loop in order to avoid collapse of a control slope and a bandwidth associated with the control loop. Furthermore, the control loop can be implemented as a single loop. Additionally, the deviation of the control signal is inversely proportional to the control slope and so as the control slope diminishes, the magnitude of the deviation increases, thereby resulting in an improved signal-to-noise ratio in respect of the deviation of the control signal being measured. Of course, the above advantages are exemplary, and these or other advantages may be achieved by the invention. Further, the skilled person will appreciate that not all advantages stated above are necessarily achieved by embodiments described herein.

The invention claimed is:

1. A control slope regulation apparatus for a control loop associated with a unit under control, the apparatus comprising:
  a processing circuit arranged to measure, when in use, a control slope for the control loop and generate a regulation signal for modifying a parameter associated with the unit under control, the regulation signal being used to maintain the control slope within a desired range for maintaining lock of the control loop;
  wherein;
    the processing circuit is further arranged to generate a reference signal having an information content corresponding to a profile that an output of the unit under control is required to follow;
    the control loop generates a control signal in order to control the output of the unit under control; and
    the control slope is measured by measuring a frequency response between the reference signal and the control signal.

2. A method of regulating a control slope of a control loop associated with a unit under control, the method comprising the steps of:
  measuring the control slope of the control loop;
  modifying a parameter associated with the unit under control in order to maintain the control slope within a desired range, thereby maintaining lock of the control loop;
  generating a reference signal having an information content corresponding to a profile that an output of the unit under control is required to follow;
  generating a control signal in order to control the output of the unit under control; and
  measuring the control slope by measuring a frequency response between the reference signal and the control signal.

3. A method as claimed in claim 2, further comprising the steps of:
  independently evaluating a magnitude of the control signal relative to a threshold value in order to determine saturation of the control signal.

4. A method as claimed in claim 2, wherein the unit under control is a power amplifier.

5. A method as claimed in claim 2, further comprising the steps of:
  modifying the parameter associated with the unit under control by a first quantum.

6. A method as claimed in claim 5, further comprising the step of:
  modifying the parameter associated with the unit under control by a second quantum in response to the control slope being outside the desired range, wherein the parameter associated with the unit under control being modified by the second quantum after elapse of a delay period.

7. A method as claimed in claim 5, wherein the reference signal is generated by a scaling process, the method further comprising the steps of:
   modifying the parameter associated with the unit under control by modifying the scaling process.

8. A method as claimed in claim 2, further comprising the steps of:
   measuring the control slope by measuring a rate of change with time of the control signal.

9. A method as claimed in claim 8, wherein the rate of change with time of the control signal is measured by band-pass filtering the control signal.

10. A method as claimed in claim 9, further comprising the steps of:
    band-pass filtering the control signal by low-pass filtering the control signal followed by high-pass filtering the control signal.

11. A method as claimed in claim 2, wherein the profile has an active portion, and wherein the control slope being measured in respect of the active portion.

12. A method as claimed in claim 11, wherein the parameter associated with the unit under control is a bias control of a power amplifier.

13. A method as claimed in claim 2, further comprising the steps of:
    providing a feedback path from the control loop in order to measure the control slope of the control loop.

14. A method as claimed in claim 13, wherein the control loop is arranged to operate in an analogue domain and the feedback path is arranged to operate in a digital domain.

15. A method as claimed in claim 13, wherein the unit under control has a tuning circuit associated therewith, the method further comprising the step of:
    modifying the parameter associated with the unit under control by modifying a parameter of the tuning circuit.

16. A method as claimed in claim 13, wherein the feedback path is disableable when the control slope is not being measured.

17. A method as claimed in claim 2, further comprising the steps of:
    providing the control signal with a perturbation.

18. A method as claimed in claim 17, wherein the perturbation is distinct from the information content corresponding to the profile.

19. A method as claimed in claim 17, wherein the perturbation is an amplitude modulation perturbation.

20. A method as claimed in claim 17, further comprising the steps of:
    modifying the parameter associated with the unit under control by a first quantum.

\* \* \* \* \*